(12) United States Patent
Curtis et al.

(10) Patent No.: US 10,122,490 B2
(45) Date of Patent: Nov. 6, 2018

(54) ADAPTIVE MODULATION AND PROTOCOL SYSTEM

(71) Applicant: ARROW ELECTRONICS, INC., Centennial, CO (US)

(72) Inventors: Christian Curtis, Arvada, CO (US); Bryce Wujek, Littleton, CO (US); Ryan-Michael Hanson, Broomfield, CO (US); Keaton Anderson, Colorado Springs, CO (US)

(73) Assignee: ARROW ELECTRONICS, INC., Centennial, CO (US)

( * ) Notice: Subject to any disclaimer, the term of this patent is extended or adjusted under 35 U.S.C. 154(b) by 0 days.

(21) Appl. No.: 15/629,264

(22) Filed: Jun. 21, 2017

(65) Prior Publication Data

US 2017/0373790 A1 Dec. 28, 2017

Related U.S. Application Data

(60) Provisional application No. 62/353,354, filed on Jun. 22, 2016.

(51) Int. Cl.
*H04B 1/00* (2006.01)
*H04W 28/18* (2009.01)
*H04L 1/00* (2006.01)
*G01R 29/033* (2006.01)
*H04W 76/22* (2018.01)

(52) U.S. Cl.
CPC .......... *H04L 1/0006* (2013.01); *H04L 1/0016* (2013.01); *H04L 1/0031* (2013.01); *G01R 29/033* (2013.01); *H04W 28/18* (2013.01); *H04W 76/22* (2018.02)

(58) Field of Classification Search
CPC ........ H04B 7/02; H04B 7/0408; H04B 1/005; H04B 1/0067; H04B 1/0075; H04W 76/22; H04W 28/18; H04M 9/087; H04L 1/0006; H04L 1/0031; H04L 1/0016; G01R 29/033

See application file for complete search history.

(56) References Cited

U.S. PATENT DOCUMENTS

| | | | | |
|---|---|---|---|---|
| 6,496,134 B1* | 12/2002 | Asahina | ............... | G01R 23/165 341/155 |
| 8,019,338 B2* | 9/2011 | Malaga | ............... | H04B 7/18506 455/431 |
| 9,743,357 B2* | 8/2017 | Tabe | ................. | H04W 52/0245 |
| 2006/0291483 A1* | 12/2006 | Sela | ........................ | H04L 12/66 370/401 |
| 2010/0138824 A1* | 6/2010 | Cho | ..................... | H04B 1/0003 717/174 |
| 2011/0039579 A1* | 2/2011 | Karjalainen | ............ | H04W 4/02 455/456.1 |

(Continued)

*Primary Examiner* — Andrew Wendell
(74) *Attorney, Agent, or Firm* — Tutunjian & Bitetto, P.C.

(57) ABSTRACT

A communication system includes a wireless interface including a transmitter, receiver, and a programmable device responsive to a communication signal to switch a communication mode in accordance with the communication signal. A module is coupled to the wireless interface and includes a processor and a memory coupled to the processor. The memory includes a protocol sensor configured to identify a given protocol for received information and employ a corresponding software protocol for further communications.

20 Claims, 6 Drawing Sheets

(56) References Cited

U.S. PATENT DOCUMENTS

| | | | | |
|---|---|---|---|---|
| 2013/0344819 | A1* | 12/2013 | Ozgur | H04B 1/40 455/78 |
| 2015/0278140 | A1* | 10/2015 | Motos | G06F 13/4022 710/317 |
| 2015/0288825 | A1* | 10/2015 | Cook | H04M 7/0069 379/220.01 |
| 2016/0154942 | A1* | 6/2016 | Delisle | H04L 67/12 702/189 |

* cited by examiner

ADAPTIVE MODULATION AND PROTOCOL SYSTEM

BACKGROUND

Technical Field

The present invention relates to communication systems and more particularly to systems and methods for adapting communication protocols on the fly without adjusting hardware modules.

Description of the Related Art

With the increase of wireless communications over a plurality of protocols, it is becoming increasingly more difficult to enable communication over multiple platforms. In order to effectuate communication between different protocols, it has been required that hardware modules be present or added to platforms to transmit and receive information between protocols.

SUMMARY

According to an aspect of the present principles, a communication system includes a wireless interface. The wireless interface includes a transmitter and receiver, and a frequency analyzer to find a best communication frequency to communicate between one or more devices and a network. A system on a module is coupled to the wireless interface and includes a processor, and a memory coupled to the processor. The memory includes a protocol sensor configured to identify a given protocol for received information and employ a corresponding software protocol for further communications.

Another communication system includes a wireless interface, the wireless interface, including: a transmitter and receiver, a frequency analyzer to find a best communication frequency to communicate between one or more devices and a network; a processor, and a memory coupled to the processor. The memory includes a protocol sensor configured to identify a given protocol for received information and employ a corresponding software protocol for further communications.

Another communication system includes a wireless interface including a transmitter, receiver, and a programmable device responsive to a communication signal to switch a communication mode in accordance with the communication signal. A module is coupled to the wireless interface and includes a processor and a memory coupled to the processor. The memory includes a protocol sensor configured to identify a given protocol for received information and employ a corresponding software protocol for further communications.

Still another communication system includes a gateway device coupled to a plurality of communication devices. The plurality of communication devices includes a plurality of communication protocols to communicate with the gateway device. The gateway device includes a programmable device responsive to communication signals of the plurality of communication devices to switch a communication mode in accordance with the communication signals. A module is coupled to the programmable device and includes a processor and a memory coupled to the processor. The memory includes a protocol sensor configured to identify a given protocol of the plurality of communication protocols and employ a corresponding software protocol for further communications in accordance with the communication signals.

Yet another communication system includes at least one dual purpose enclosure configured as a switching station and a charging station for batteries of software radio devices (SDRs), the at least one dual purpose enclosure includes an SDR base station having an SDR for communicating with a plurality of communication devices each including an SDR. The plurality of communication devices includes a plurality of communication protocols. The SDR includes a programmable device responsive to communication signals of the plurality of communication devices to switch a communication mode in accordance with the communication signals, and a module coupled to the programmable device. The module includes a processor and a memory coupled to the processor, the memory including a protocol sensor configured to identify a given protocol of the plurality of communication protocols and employ a corresponding software protocol for further communications in accordance with the communication signals.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
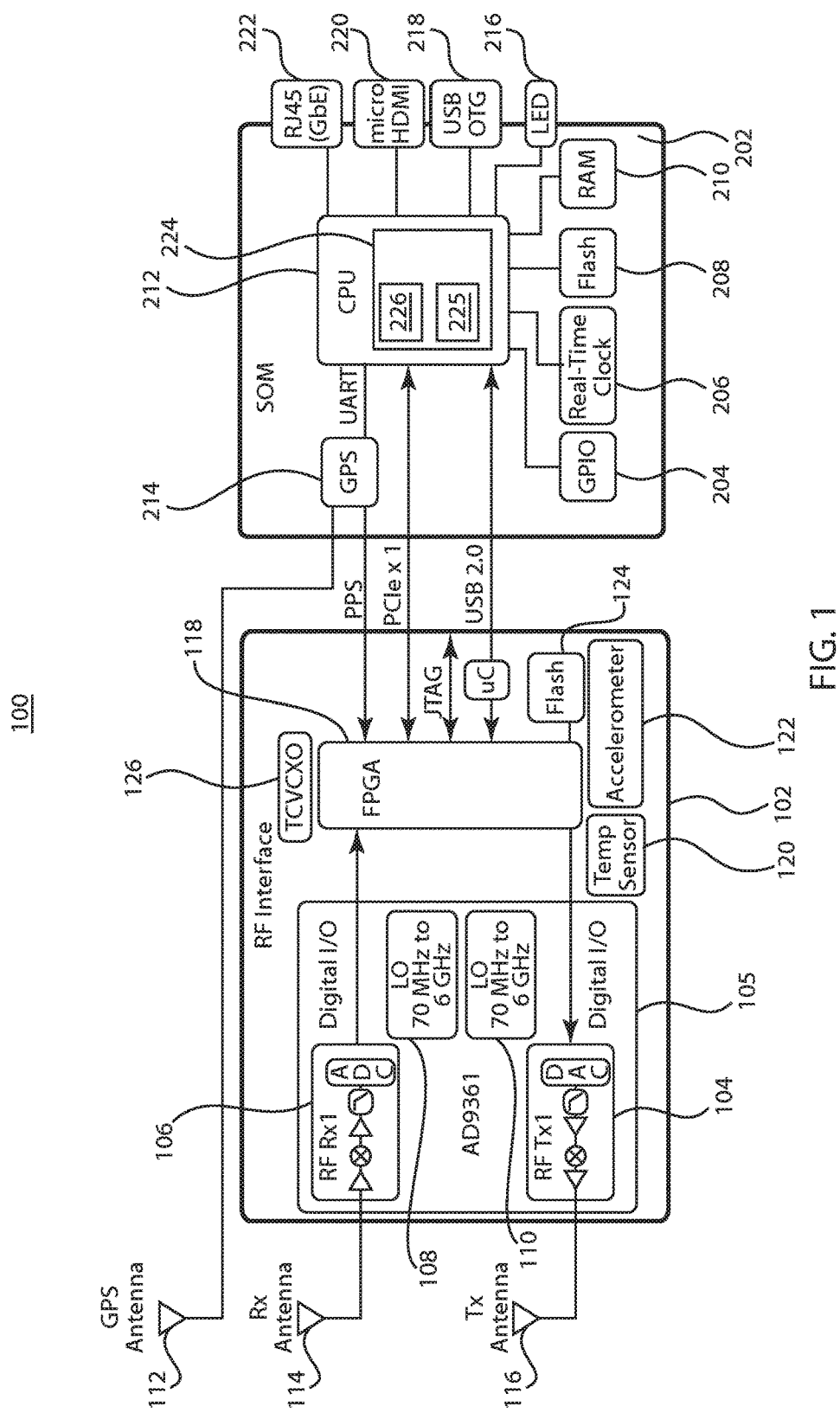
FIG. 1 is a block/flow diagram illustrating a communication system or bridge in accordance with the present principles.

In accordance with the present principles, systems and methods provide communication flexibility between protocols. In one particularly useful embodiment, a communication system includes an interface module coupled to a system on a module (SOM) to provide a software defined radio (SDR). The SDR has wireless agility, which includes the unique ability to change frequency as well as wireless protocol via software control. This capability historically required a board re-design or replacement.

In one embodiment, the present principles provide an extremely robust wireless communication system capable of uninterrupted operation in largely overcrowded radiofrequency (RF) or other environments (e.g., sports stadiums, concert venues, etc.). High reliability comes from its ability to change to an open frequency or frequencies. In another embodiment, an extremely flexible, multi-protocol, sensor gateway is provided capable of translating or bridging a large number of wireless protocols. In a particularly useful embodiment, internet of things (IoT) wireless sensors may have their data combined from different protocols (e.g., ZigBee, Bluetooth, Lora, etc.). In another embodiment the SOM may be replaced by reconfigurable memory or software applications.

In accordance with one embodiment, a voice communication system is included and is comprised of wired and wireless headsets, capable of point-to-point and point-to-multipoint encrypted wireless voice and data communication. The system is able to easily change frequency bands and is fully functional in heavy RF traffic. Internet protocol (IP) based communication may be employed to allow for video and data sharing.

Embodiments described herein may be entirely hardware, entirely software or including both hardware and software elements. In one embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

Each computer program may be tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Referring now in detail to the figures in which like numerals represent the same or similar elements and initially to FIG. 1, a communication system 100 includes an interface module 102 coupled to a system on a module (SOM) 202 to provide a software defined radio (SDR) system. The interface module 102 may include an RF transceiver 105 based on, e.g., an Analog Device RF Transceiver (e.g., chip AD9361). Other communication interfaces and chip sets can also be employed. The interface module 102 is adapted to handle a wide frequency range to cover a number of standard protocols. In one embodiment, the interface protocol is configured to operate in the RF frequency range of between about 70 MHz to about 6 GHz, although other frequency ranges may be employed. The interface module 102 includes an RF receiver 106 and antenna 114, an RF transmitter 104 and antenna 116, which are controlled using local oscillators (LO) 108 and 110, respectively to adjust frequencies within the operating frequency ranges.

The interface module 102 includes a field programmable gate array (FPGA) 118 configured to provide signal filtering and include processing code within the FPGA 118 to adjust protocols. The FPGA 118 interface includes a pulse per second (PPS) signal that has a width of, e.g., less than one second and a sharply rising or abruptly falling edge that repeats once per second. PPS signals are output by a global position system (GPS) 214 receiver, which includes an antenna 112. The system 100 may include protocol independent location tracking, using GPS, WiFi, etc. This can determine the locations of users to each other or to a base station (see e.g., FIG. 4).

PCIe x1 is a peripheral interface between a CPU 212 of the SOM 202 and the FPGA 118. Other interfaces may also connect the FPGA 118 and the CPU 212 including but not limited to USB (e.g., USB 2.0), etc. The interface module 102 includes a temperature compensated voltage controlled oscillator (TCVCXO) 126 to account for temperature variations in the input and output signals. A temperature sensor 120 may be provided for measuring temperature, and an accelerometer 122 may be provided to measure motion, e.g., to determine motion of the user to determine whether the user is mobile or stationary or any other useful purpose.

Flash memory 124 or other memory may also be provided. The SOM 202 includes the CPU 212 and one or more forms of memory. The memory may include flash memory 208, random access memory (RAM) 210 or solid state or other programmable memory 224 (included in the CPU or as a separate hard drive or chip). A general purpose input/output (GPIO) 204 may be employed to interface with the CPU 218. Other I/O ports may include an RJ45 port 222, an HDMI port 220, a USB port 218, a light emitting diode (LED) port 218, etc. A real-time clock 206 may also be employed.

The CPU 218 and FGPA 118 may be programmed to adapt to any protocol using software. The CPU 218 includes an operating system (e.g., LINUX) that can provide differentiated management and intelligence capabilities. The inputs to the SOM 202 may include voice communications, video and data communications or any other communication signals within the expanded operating frequency range. The received frequencies are employed to indicate communication frequency ranges, then the information received is tested against a plurality of protocols programmed into the system 100 (e.g., in memory 224, 208, 210 or 124). The system 100 is frequency agile and capable of operation at any frequency. In addition, it is simple to change frequency by making adjustment to the local oscillators 108 and 110. The local oscillators 108 and 110 can be controlled using the FPGA 118 and/or the CPU 212. The FPGA 118 can be switched to enable the appropriate communication protocol for transmit and receive communications. The FPGA 118

(and/or CPU 212) can provide a signal path to an appropriate protocol or algorithm so that communication protocol independence is achieved. For example, a user with a first protocol can communicate with a user using a second protocol through the use of communication system 100 as a hub or as a user device.

The system 100 is also protocol agile and capable of operation with any conceivable protocol (e.g., Wi-Fi, Zigbee, ZWave, LTE, CDMA, GSM, etc.). Using the incoming signals, the system 100 performs frequency and/or protocol sniffing to sniff multiple types of wireless signals without a change of hardware. A protocol sensor 225 is configured to identify a given protocol for received information and employ a corresponding software protocol (stored in memory) for further communications. The protocol sensor 225 can compare protocols and such for indicia that indicate the use of a particular protocol. This can include signal types, pulse widths, program or algorithm characteristics, other clues, etc.

In accordance with the incoming frequency, data/information is received by the system 100. The CPU 212 tests the data/information for its protocol. The protocol can be tested using clues in the incoming communication, known information (e.g., only WiFi is employed in this region) or using a trial and error procedure. Once the protocol is determined, the protocol is implemented, and the FPGA 118 is programmed to interact using that protocol. The FPGA 118 can dynamically change the protocol or program path to a protocol algorithm with each communication. In addition, the FPGA 118 can adjust the local oscillators (LO) to match the appropriate transmission/receive frequency or frequencies.

In one embodiment, a spectrum analyzer 226 may be implemented by the CPU 212 and memory 224 to determine incoming signal frequencies. The CPU 212 provides self-healing communication and is able to diagnose a poor connection (e.g., based on signal to noise ratio (SNR) or other criteria) and can automatically connect to a different frequency, if needed. The system 100 can listen to incoming signals or search for signals in a particular frequency range. The system 100 can respond to the incoming signals using a same frequency range or may adjust the frequency range to a better channel if the device being communicated with can also change to the new channel (frequency range) or if transmissions being received span different frequencies and/or protocols. In one example of listening, the system 100 may include a radio astronomy application and monitor radio emissions from celestial objects using RF.

The system 100 may be portable and include a portable power source (battery, solar, etc.). In other configurations, the system 100 may include a grid power source. The system 100 may connect to a wired or wireless network.

In one embodiment, the FPGA 118 may be more advanced and handle some or all of the operations and functions of the SOM 202. For example, the FPGA 118 may be configured to run algorithms, to test communications lines, to switch to different protocols as needed, etc.

Figure 2:
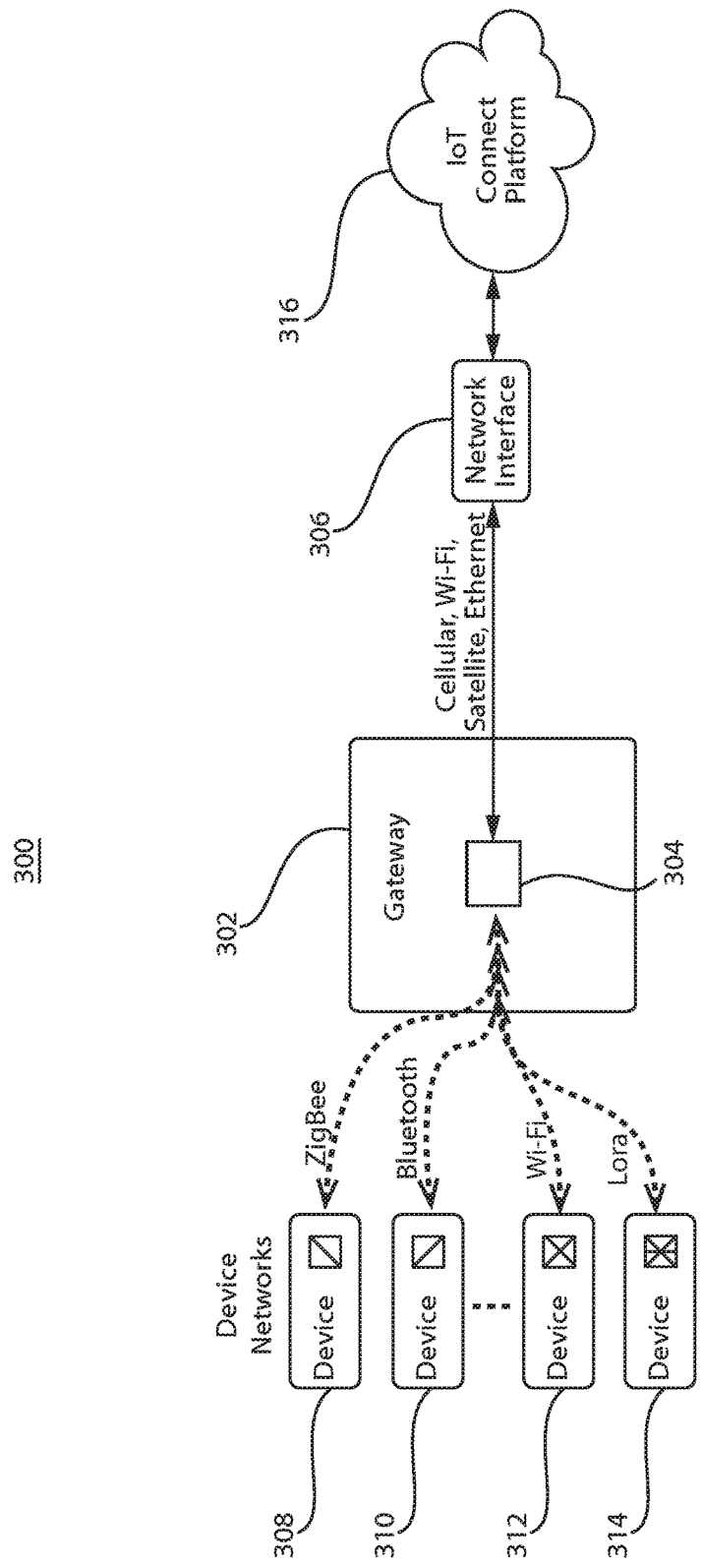
FIG. 2 is a block/flow diagram illustrating a communication bridge between devices using different protocols and a network interface in accordance with the present principles.

Referring to FIG. 2, in one embodiment, the system 100 includes a gateway device 302 employed to bridge or connect components using different protocols in one system 300. The system 300 may include a plurality of devices 308, 310, 312, 314 or device networks that can interface with the gateway device 302. In one example, device 308 includes a ZigBee protocol, device 310 includes a Bluetooth protocol, device 312 includes a WiFi protocol and device 314 includes a Lora protocol. It should be understood that any number of devices may be employed, and the devices may include any known protocol.

The gateway 302 includes protocol code modules 304, stored in memory. Wireless protocols no longer need hardware adaptor modules as the code modules 304 are more flexible and can be reset or changed quickly and efficiently. The code modules 304 permit communication between the devices 308-314 having different protocols and a network interface 306 or interfaces that employ different technologies or protocols, e.g., cellular, WiFi, satellite, Ethernet, etc. The network interface 306 can communicate with a network, such as the Internet, Internet of Things (IoT), the cloud, local area networks, home networks, voice over Internet (VoIP), etc. The gateway device 302 is capable of acting as a single point gateway for the different protocol devices 308-314, which may come on-line and go off-line. The gateway device 302 can organize and prioritize different protocol radios on the fly/according to software rules stored therein. The software rules may include acceptable frequency ranges, acceptable signal power, identifiable protocols, etc.

The devices 308-314 of the system 300 can each include a wireless (or wired) interface with a transmitter and receiver. A frequency analyzer in the gateway 302 can find a best communication frequency to communicate between the one or more devices 308-314 and the network 316 through the network interface 306. The devices 308-314 can include a system on a module (SOM) including a processor, and a memory coupled to the processor. The memory can include a protocol sensor configured to identify a given protocol for received information and employ a corresponding software protocol for further communications.

Devices 308-314 (or additional or fewer devices) can join the communication or drop out of the communication based on one or more criteria. The criteria can include authorization codes or protocols, distance from the gateway or hub 302, type of communication protocol, identity of the user/device, channels used, frequency used, etc.

In one embodiment, the gateway device 302 may encounter a protocol that is not identifiable or is not loaded on the gateway device 302. The gateway device 302 may communicate with the Internet or other network, to identify the protocol and download the protocol needed for such communication. While the gateway device 302 is preferably employed as a wireless communication device to provide a software defined radio (SDR), the gateway device 302 may include one or more wired connections to either devices 308-314 or to the network interface 306. The gateway device 302 is configured to be versatile to connect/run on almost any cloud platform (e.g., Microsoft Azure™, Amazon AWS™, IBM Bluemix™, etc.).

Figure 3:
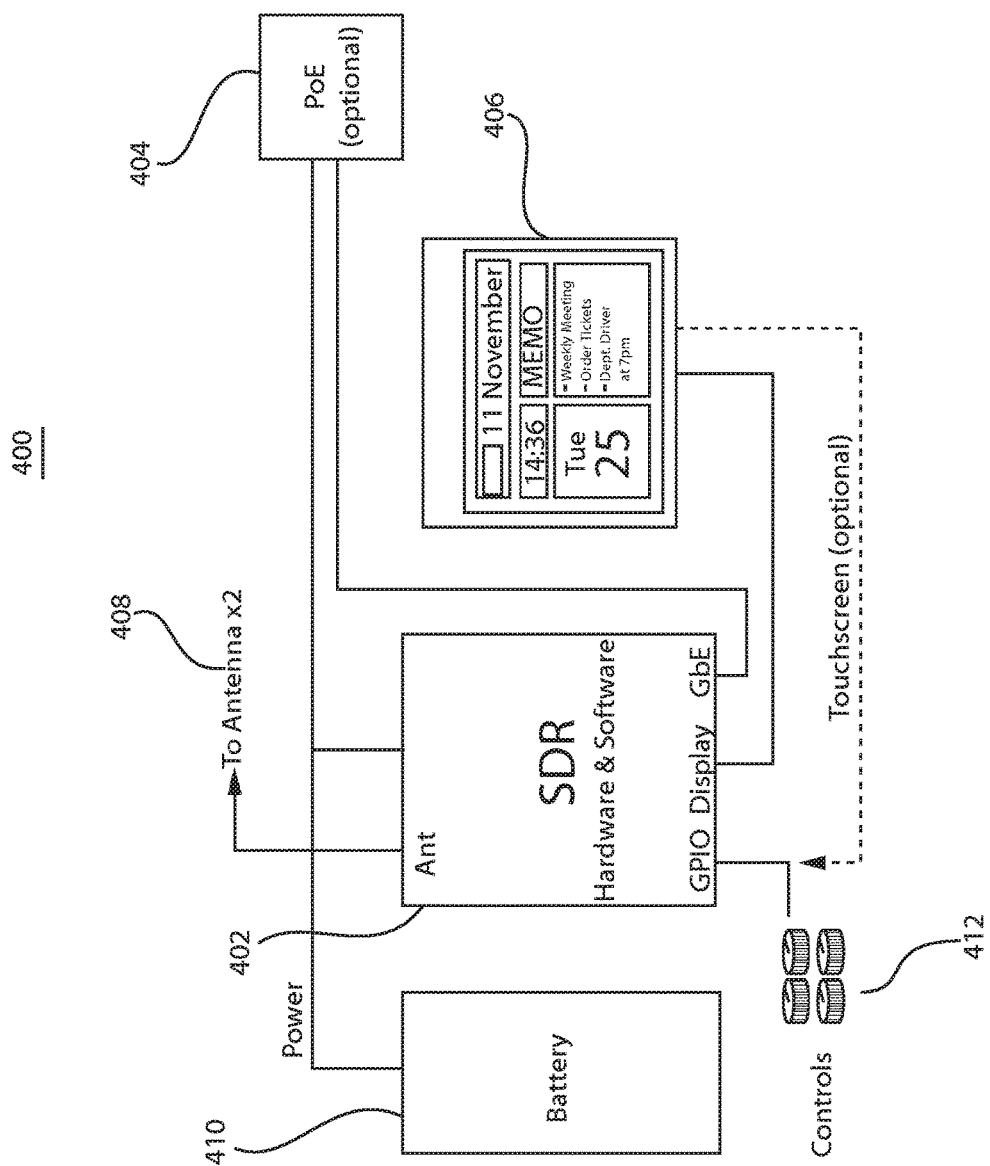
FIG. 3 is a block/flow diagram illustrating programming and interfacing with a software radio device (SDR) in accordance with the present principles.

Referring to FIG. 3, an SDR device 402 is shown in accordance with another configuration 400. The SDR device 402 includes hardware and software capabilities and connects to a display device 406, which may include a touchscreen. The SDR 402 may be powered by a battery 410, plugged into grid power, power over Ethernet (PoE) 404 or any combination thereof (e.g., PoE with battery back-up, etc.). The SDR 402 may include input/output connections (e.g., GPIO, display, GbE, etc.) to permit interfacing therewith. The SDR 402 may be programmed using controls 412 for signals received over antenna 408 or from the Ethernet or other network 404. The programming of SDR 402 may include downloading protocols, setting software controls, setting protocol conditions for the selection of protocols, selecting conditions/thresholds for frequency hopping (channel hopping), etc.

Figure 4:
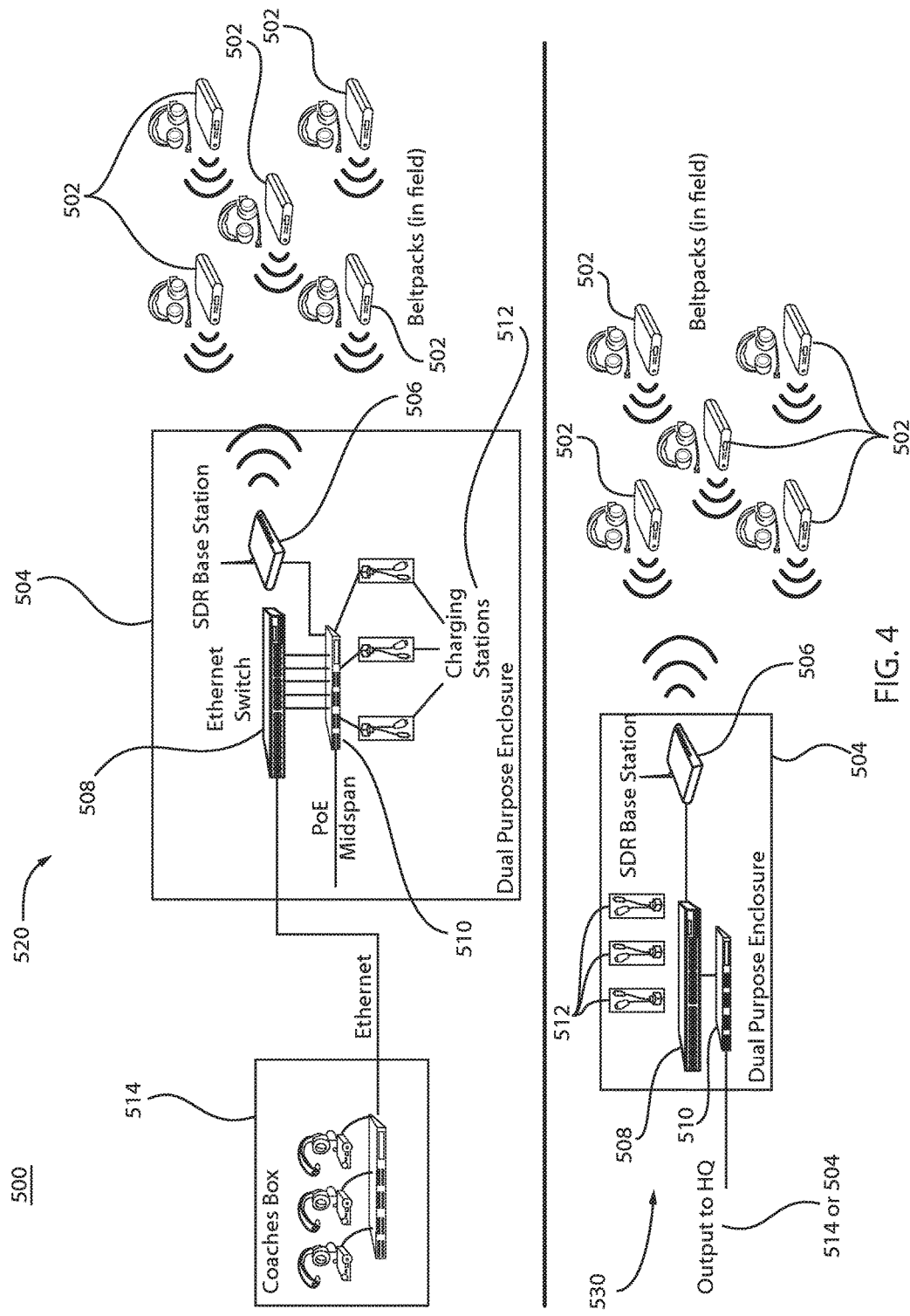
FIG. 4 is a block/flow diagram illustrating an application for the SDR system using multiple belt pack devices in accordance with the present principles.

Referring to FIG. 4, an exemplary implementation of a voice communication system 500 is illustratively shown in accordance with one embodiment. The system 500 includes a multiple user system where a plurality of mobile users employ beltpacks 502 with wireless communication capabilities. The beltpacks 502 may include one or more communication protocols and can operate in one more different frequency ranges or channels. The beltpacks 502 may include a portable power source, a microphone, speakers and other peripherals, e.g., displays, volume controls, channel controls, etc. The beltpacks 502 may be employed by users in the field, e.g., in sports scenarios, emergency scenarios (e.g., among coaches/players in a football arena, among fire fighters in forest fires, etc., among police at crime scenes, etc.).

A dual purpose enclosure 504 functions as a receiver/interface station and a charging station for the beltpacks 502. The enclosure 504 may be portable and may be mounted on an emergency vehicle or employed as a base station. The enclosure 504 includes one or more SDRs 506, which can bridge a plurality of frequency ranges and protocols through to a network, headquarters network or computer 514. In the present example, the SDR 506 communicates over a plurality of channels using an Ethernet switch or router 508. A PoE midspan 510 is provided to permit recharging of the beltpacks 502 as needed. The dual purpose enclosure 504 acts as a charging station for the beltpacks 502, but can also provide a wired connection with power in case of RF or battery issues.

The system 500 may include a plurality of cells 520, 530. Each cell 520, 530 may report to a common network 514, to each other, to other networks or any combination thereof. It should be understood that the beltpacks 502 include one example, of a wireless device. Other wireless devices may be employed in accordance with the present principles. For example, cell phones, tablets, wireless sensors, modems, etc.

The system 500 can be a closed system to provide secure communications within the system 500, but using and suitable protocol. For example, the security measures can include a type of device employed, an identification for the user, the proximity of the user, etc.

Figure 5:
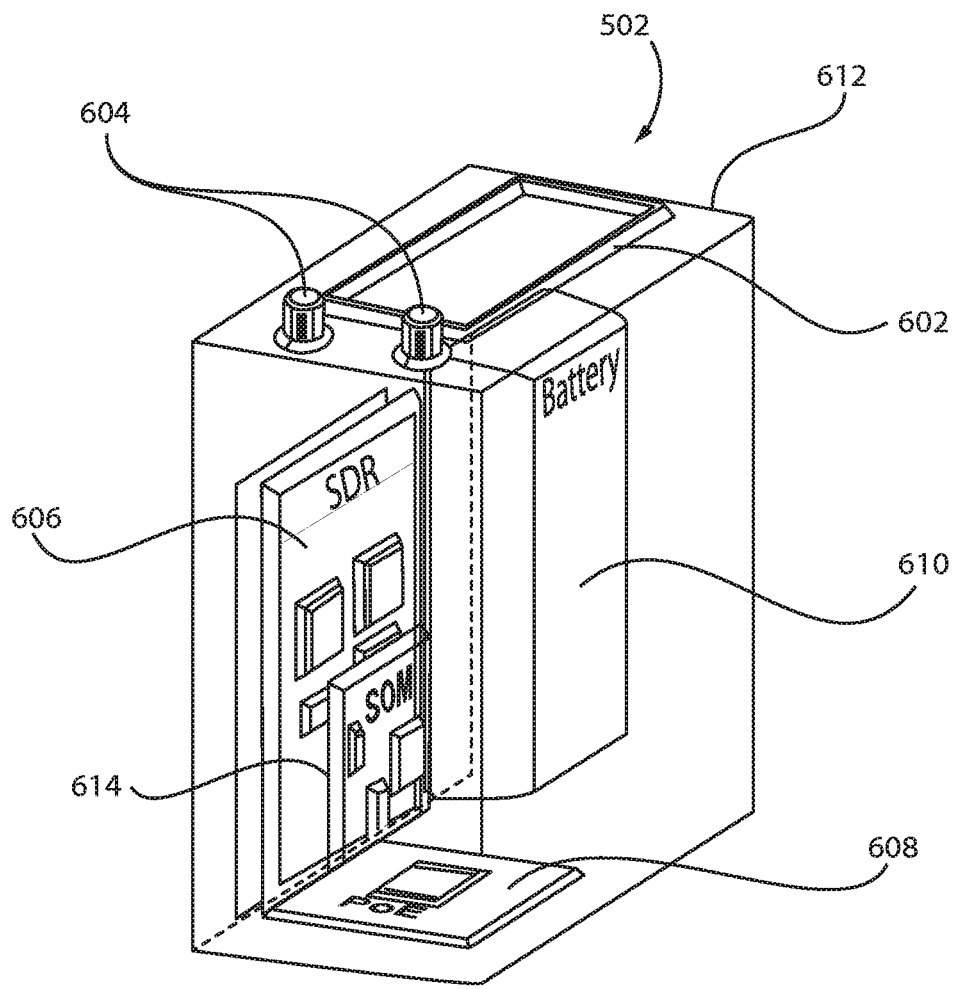
FIG. 5 is a perspective view illustrating a belt pack device for the application of the SDR system of FIG. 4 in accordance with the present principles.

Referring to FIG. 5, an exemplary belt pack 502 is illustratively shown in greater detail in accordance with one embodiment. The belt pack 502 includes a housing 612 configured to mount or support the components of the belt pack 502. Within the housing 512, an SDR 606 with a SOM 614 is provided. A battery 610 provides power to the functions and components of the belt pack 502.

A PoE chip 608 permits interfacing with charging stations to enable recharging of the belt pack 502. The belt pack 502 includes a display 602, which permits interfacing with the belt pack 502 and its components. The belt pack 502 also includes controls 604, which may be employed to adjust channels, volume, etc. The belt pack 502 may include other interfaces and connections. For example, headphone jacks, data ports, USB ports, etc. may be provided.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise cables, optical fibers, wireless transmission, etc. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, machine instructions, machine dependent instructions, microcode, firmware instructions, source code or object code written in any combination of one or more programming languages, including an object oriented programming language such as C++ or the like, and conventional procedural programming languages, such as the "C" programming language or similar programming languages.

In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 6:
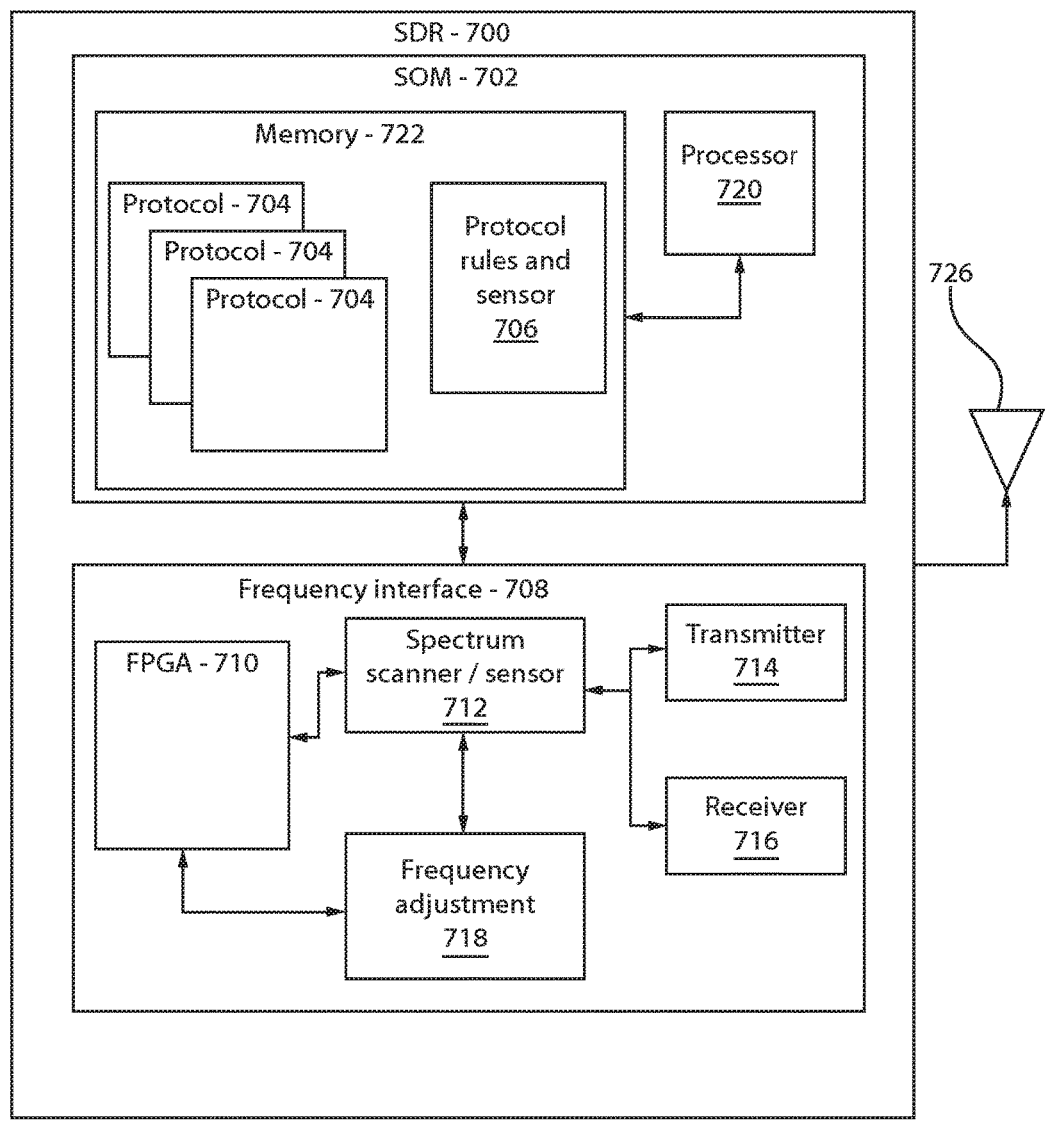
FIG. 6 is a block/flow diagram illustrating software aspects for the SDR system in greater detail in accordance with the present principles.

Referring to FIG. 6, a communication system 700 includes an interface module 708 coupled to a system on a module (SOM) 702 to provide a software defined radio (SDR) system in accordance with an embodiment. The interface module 708 includes a transmitter 714 and a receiver 716 adapted to handle a wide frequency range of signals (e.g., between about 70 MHz to about 6 GHz, although other frequency ranges may be employed). The interface module 708 connects with one or more antennas 726.

The interface module 708 includes a field programmable gate array (FPGA) 710 configured to provide signal filtering and include processing code within the FPGA 710 to adjust protocols. A spectrum analyzer/scanner 712 functions as a sensor to determine the frequencies being received by the SDR 700. The spectrum analyzer/scanner 712 can also adjust the transmission frequency of the transmitter 714 as needed. A frequency adjustment module or circuit 718 reviews the available frequency ranges to determine a best frequency range for continued communication.

The SOM 702 includes a processor 720 coupled to memory 722. Memory 722 stores a plurality of protocols as software modules 704. Received information is checked to identify a given protocol using protocol rules and sensor module 706. The sensor module 706 compares incoming information against a look up table or other mechanism to look for protocol signatures and clues. In one embodiment, the sensor 706 attempts to employ each protocol to decipher the incoming information. If no protocol is found, the sensor 706 can enable a download of the needed protocol by accessing a network to identify and provide the needed protocol. Once the protocol is identified, the protocol and the frequency range of communication are established and can be employed for further communication. The SDR 700 may engage in multiple communications across a plurality of protocols and frequency ranges and can translate between different network protocols.

In useful embodiments, the SDR 700 may engage in communications with any number of parties using any protocol. The number of users can increase or decrease over time by the joining or unjoining of users of the system. The users can communicate with each other despite the protocol or differences in protocols or transmission modes as the plurality of protocols and frequency ranges can translate between different network protocols.

Aspects as described throughout this disclosure may be combined between any of the embodiments described herein. For example, the system 700 may include any of the additional features as described with respect to systems 100, 300, 500, etc. in any combination.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention. Having thus described aspects of the invention, with the details and particularity required by the patent laws, what is claimed and desired protected by Letters Patent is set forth in the appended claims.

What is claimed is:
1. A communication system, comprising:
 a wireless interface including:
  a transmitter and receiver, and a programmable device responsive to a communication signal to switch a communication mode in accordance with the communication signal; and a module coupled to the wireless interface and including:
a processor, and
a memory coupled to the processor, the memory including a protocol sensor configured to identify a given protocol for received information and employ a corresponding software protocol for further communications.

2. The communication system as recited in claim 1, wherein the programmable device includes a field programmable gate array.

3. The communication system as recited in claim 1, further comprising at least one local oscillator having a frequency selected by the programmable device in accordance with the communication signal.

4. The communication system as recited in claim 1, wherein module includes a frequency analyzer to find a best communication frequency for communication between devices.

5. The communication system as recited in claim 1, wherein module includes one or more connection ports associated with a plurality of signal protocols.

6. The communication system as recited in claim 1, further comprising a plurality of protocols programmed into the memory and being selected in accordance with the communication signal.

7. The communication system as recited in claim 1, further comprising a global positioning system to provide location information.

8. The communication system as recited in claim 1, further comprising a plurality of devices each including the communication system and communicating with each other using different protocols and communication frequencies.

9. A communication system, comprising:
a gateway device coupled to a plurality of communication devices, the plurality of communication devices including a plurality of communication protocols to communicate with the gateway device;
the gateway device including:
a programmable device responsive to communication signals of the plurality of communication devices to switch a communication mode in accordance with the communication signals; and
a module coupled to the programmable device and including:
a processor, and
a memory coupled to the processor, the memory including a protocol sensor configured to identify a given protocol of the plurality of communication protocols and employ a corresponding software protocol for further communications in accordance with the communication signals.

10. The communication system as recited in claim 9, wherein the programmable device includes a field programmable gate array.

11. The communication system as recited in claim 9, further comprising at least one local oscillator having a frequency selected by the programmable device in accordance with the communication signal.

12. The communication system as recited in claim 9, wherein module includes a frequency analyzer to find a best communication frequency.

13. The communication system as recited in claim 9, wherein the gateway connects to a network interface using one or more connection ports associated with a plurality of different signal protocols.

14. The communication system as recited in claim 9, wherein the gateway is configured to download a protocol absent from the memory through the network interface.

15. The communication system as recited in claim 9, wherein the plurality of devices are connected to different device networks.

16. A communication system, comprising:
at least one dual purpose enclosure configured as a switching station and a charging station for batteries of software radio devices (SDRs);
the at least one dual purpose enclosure including an SDR base station having an SDR for communicating with a plurality of communication devices each including an SDR, the plurality of communication devices including a plurality of communication protocols;
the SDR including:
a programmable device responsive to communication signals of the plurality of communication devices to switch a communication mode in accordance with the communication signals; and
a module coupled to the programmable device and including:
a processor, and
a memory coupled to the processor, the memory including a protocol sensor configured to identify a given protocol of the plurality of communication protocols and employ a corresponding software protocol for further communications in accordance with the communication signals.

17. The communication system as recited in claim 16, wherein the programmable device includes a field programmable gate array.

18. The communication system as recited in claim 16, further comprising at least one local oscillator having a frequency selected by the programmable device in accordance with the communication signal.

19. The communication system as recited in claim 18, wherein module includes a frequency analyzer to find a best communication frequency.

20. The communication system as recited in claim 18, wherein the plurality of communication devices include belt packs.

* * * * *